United States Patent
Eisner et al.

(10) Patent No.: US 7,484,187 B2
(45) Date of Patent: Jan. 27, 2009

(54) CLOCK-GATING THROUGH DATA INDEPENDENT LOGIC

(75) Inventors: Cynthia Rae Eisner, Zichron Yaacov (IL); Peter Hofstee, Austin, TX (US); Alexander Itskovich, Yokne'am lit (IL) 20692; Daniel Lawrence Stasiak, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 11/295,936

(22) Filed: Dec. 7, 2005

(65) Prior Publication Data

US 2007/0130549 A1 Jun. 7, 2007

(51) Int. Cl.
G06F 17/50 (2006.01)

(52) U.S. Cl. .................. 716/2; 716/4; 716/5; 716/6

(58) Field of Classification Search .................. 716/1–6, 716/18
See application file for complete search history.

(56) References Cited

U.S. PATENT DOCUMENTS

| | | | |
|---|---|---|---|
| 3,783,254 A | 1/1974 | Eichlberger | |
| 4,378,595 A | 3/1983 | Current | |
| 4,580,066 A | 4/1986 | Berndt | |
| 5,422,918 A | 6/1995 | Vartti et al. | |
| 5,629,643 A | 5/1997 | Moughanni et al. | |
| 5,926,520 A | 7/1999 | Yano | |
| 6,144,241 A | 11/2000 | Wong | |
| 6,437,625 B1 | 8/2002 | Kojima et al. | |
| 6,812,759 B2 | 11/2004 | Suzuki | |
| 7,080,334 B2 * | 7/2006 | Fan et al. | 716/6 |

FOREIGN PATENT DOCUMENTS

EP 263377 9/1987

OTHER PUBLICATIONS

F. Theeuwen, E. Seelen, "Power reduction through clock gating by symbolic manipulation", Proc. IFIP Int. Workshop on Logic and Architecture Synthesis, 1996.
N. Raghavan, V. Akella, S. Bakshi, "Automatic Insertion of Gated Clocks at Register Transfer Level", Proc. Twelfth International Conference on VLSI Design, 1999.
T. Lang, E. Musoll, J. Cortadella, "Individual Flip-Flops with Gated Clocks for Low Power Datapaths", IEEE Transactions on Circuits and Systems—II: Analog and Digital Signal Processing, Vol. 44, No. 6, Jun. 1997.
L. Benini, G. De Micheli, E. Macii, M. Poncino, R. Scarsi, "Symbolic Synthesis of Clock-Gating Logic for Power Optimization of Control-Oriented Synchronous Networks", 1997 European Design and Test Conference.
IBM Technical Disclosure Bulletin Vol. 32, No. 11, 4-90, pp. 320-321, SRL for LSSD. Eliminating Clock Gating, Apr. 1990.

* cited by examiner

*Primary Examiner*—Vuthe Siek

(57) ABSTRACT

Given a function F of a circuit having a data latching device and a feedback loop feeding an output Q of the device into logic which feeds the device, a method includes extracting at least one data independent case and clock-gating the device with the at least one data independent case. The method also includes eliminating the feedback loop if function F depends only on Q with a positive polarity or leaving the feedback loop if function F depends on Q in both positive and negative polarities.

5 Claims, 6 Drawing Sheets

CLOCK-GATING THROUGH DATA INDEPENDENT LOGIC

FIELD OF THE INVENTION

The present invention relates to circuit design generally and to the reduction of feedback loops in a circuit listing in particular.

BACKGROUND OF THE INVENTION

Complicated pieces of hardware typically comprise millions of transistors. Logic designers typically utilize computer-aided design programs to aid their design process. Once a designer has finished the conceptual design of a circuit, there are many optimizations which can be made.

For example, for low power design, it is often useful to add logic elements to keep elements from operating when they are not needed.

For example, flip-flops are controlled by clocks. When the clock signal goes high, the flip-flop puts out a value calculated from its inputs. It will do so, irrespective of whether or not the inputs have changed. A logic designer, when coming to determine how to minimize the power consumption of his circuit, may review the activities of the flip-flops and may "gate" those which he knows will not change value given a particular situation. To do so, the designer may add circuitry to disconnect the clock input to the flip-flop. Thus, the flip-flop will maintain its output until the clock input is returned.

The following articles discuss automatic clock-gating methods:

L. Benini, G. De Micheli, E. Macii, M. Poncino, R. Scarsi, "Symbolic Synthesis of Clock-Gating Logic for Power Optimization of Control-Oriented Synchronous Networks", 1997 European Design and Test Conference;

T. Lang, E. Musoll, J. Cortadella, "Individual Flip-Flops with Gated Clocks for Low Power Datapaths", EEE Transactions on Circuits and Systems—II: Analog and Digital Signal Processing, Vol. 44, No. 6, June 1997; and F. Theeuwen, E. Seelen, "Power Reduction through Clock Gating by Symbolic Manipulation", Proc. IFIP Int. Workshop on Logic and Architecture Synthesis, 1996; and N. Raghavan, V. Akella, S. Bakshi, "Automatic Insertion of Gated Clocks at Register Transfer Level", Proc. Twelfth International Conference on VLSI Design, 1999.

Another optimization involves simplifying the layout of the circuit. Since there are so many circuit elements and all have to be connected in the appropriate ways to each other, simplifying the layout may improve the circuit. One complicating element in a layout is a feedback loop, where the output of some element, typically a flip-flop, is utilized by the logic eventually feeding into the element.

Reference is now made to FIG. 1, which illustrates a simple circuit 10. Circuit 10 includes a multiplexer 12 and a flip-flop 14. Flip-flop 14 receives two inputs, a clock input CLK and a data input D generated by multiplexer 12 and provided along a wire 19. When clock signal CLK rises, flip-flop 14 latches the value of D to generate a latched output Q. Output Q is fed back into multiplexer 12 (generating a feedback loop 16). Multiplexer 12 chooses between two inputs, the output I of some function, indicated by a cloud 18, of inputs A, B, C and output Q of flip-flop 14, as a function of the state of an enable signal EN. The logic for circuit 10 may be written as: if (CLK=1 and EN=1): then I, else Q.

It is known that circuit 10 can be replaced by a simpler circuit 20, shown in FIG. 2 to which reference is now made, formed of a flip-flop 24 and a gate 22 generating the clocking signal to flip-flop 24. Gate 22 ANDs together enable signal EN and clock signal CLK, thereby activating flip-flop 24 to latch signal I only when enable signal EN is positive. The logic for circuit 20 may also be written as: if (CLK=1 and EN=1): then I, else Q.

It will be appreciated that circuit 20 is a clock-gated circuit. Flip-flop 24 only receives clock signal CLK when the enable signal EN allows it. This may provide some power reduction as flip-flop 24 is not active at every tick of clock signal CLK.

It will be appreciated that the layout of circuit 10 is more complicated than that of circuit 20, due to feedback loop 16. As a result, flip-flop 14 should be located relatively close to multiplexer 12, in order to minimize the length of wire 19 and feedback loop 16. In contrast, circuit 20 is simpler to layout, since only the wire, labeled 23, between gate 22 and flip-flop 24 need be considered. Furthermore, when designing an entire chip (rather than a chip fragment as shown in FIGS. 1 and 2), wires are not allowed to cross. If two wires cross on paper, then in the actual chip, one must go over or under the other. They cannot be in the same metal layer. By eliminating feedback loop 16 of circuit 10, there is one less wire to consider and less crossing to worry about.

Unfortunately, simple cases like circuit 10 are not commonly found. A logic designer may manually review the entire design to find feedback loops to eliminate; however, such a review is difficult and the benefit (the elimination of a single feedback loop) is not large, and thus, a logic designer will remove a feedback loop only when he sees an obvious one.

SUMMARY OF THE PRESENT INVENTION

The present invention, on the other hand, may provide a new method for finding feedback loops to eliminate and/or for clock-gating circuits with flip-flops, latches or other types of data latching devices.

For a function F of a circuit having a data latching device and a feedback loop feeding an output Q of the device into logic which feeds the device, there is provided, in accordance with a preferred embodiment of the present invention, a method which includes extracting at least one data independent case and clock-gating the device with the at least one data independent case.

Additionally, in accordance with a preferred embodiment of the present invention, the method also includes eliminating the feedback loop if function F depends only on Q with a positive polarity.

Moreover, in accordance with a preferred embodiment of the present invention, the eliminating includes generating a gating function G for the device which generates a 1 when the output of function F (as a function of Q) is defined to have a value of 1 or 0, ANDing gating function G and a clock signal to generate the clock gating function to the device and generating a data input function H for the device which passes a 1 when original function F(Q) is defined to be a 1, a 0 when original function is defined to be a 0 and any value for all other cases.

Further, in accordance with a preferred embodiment of the present invention, the first step of generating includes creating a binary decision diagram (BDD) for the circuit with a variable representing the output Q as the last variable in the BDD and creating a binary decision diagram (BDD) for the gating function G by replacing all Q nodes with a 0 node and by replacing all leaf nodes with a 1 node.

Still further, in accordance with a preferred embodiment of the present invention, the second step of creating includes generating a BDD for the data function H by replacing all positive Q nodes with a don't care node.

Further, in accordance with a preferred embodiment of the present invention, the first step of creating is replaced with generating a BDD where said output Q is not the last variable in said BDD and the second and third steps of creating are the equivalent BDD operations but for the case that the output Q is not the last variable in the BDD.

Moreover, in accordance with an alternative preferred embodiment of the present invention, the method may also include leaving the feedback loop if the function F depends on Q in both positive and negative polarities.

Further, in accordance with the alternative preferred embodiment of the present invention, the clock-gating includes generating a gating function G3 by ORing two other gating functions G1 and G2 together, where gating function G1 generates a 1 when the output of an original function F defining the output of the device is defined to have a value of 1 or 0 and gating function G2 generates a 1 when original function F is defined to be NOT Q and 0 otherwise, ANDing gating function G3 and a clock signal to generate the clock gating function to the device and generating a data input function H for the device which passes a 1 when original function F is defined to be a 1, a 0 when original function is defined to be a 0, a negative Q when original function F is defined to be negative Q and any value for all other cases.

Still further, in accordance with the alternative preferred embodiment of the present invention, the first step of generating includes creating a BDD for the first gating function G1 by replacing all Q nodes with a 0 node and by replacing all leaf nodes with a 1 node and creating a BDD for the second gating function G2 by replacing all negative Q nodes with the 1 node and all leaf nodes with the 0 node.

Moreover, in accordance with the alternative preferred embodiment of the present invention, the second step of generating includes creating a BDD for the data function H by replacing all positive Q nodes with a don't care node.

Further, in accordance with a preferred embodiment of the present invention, the first step of creating is replaced with generating a BDD where said output Q is not the last variable in said BDD and the second and third steps of creating are the equivalent BDD operation but for the case that the output Q is not the last variable in the BDD.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
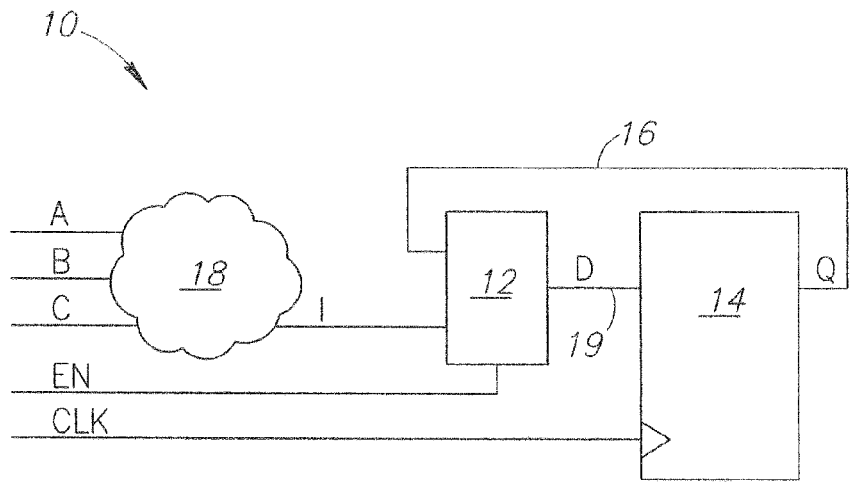
FIG. 1 is a schematic illustration of a simple, prior art circuit with a feedback loop.
Figure 2:
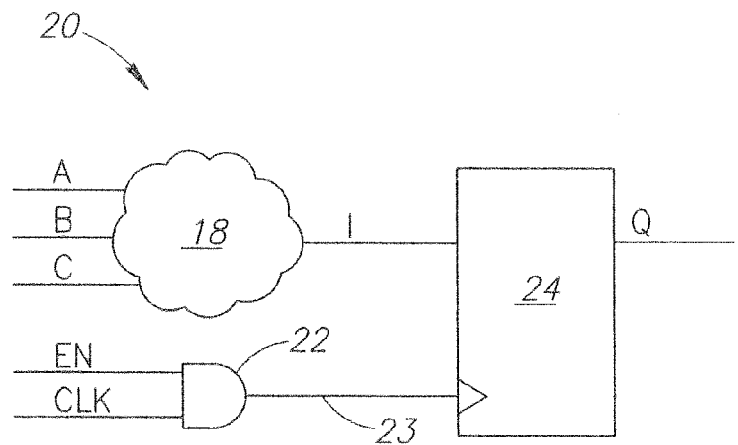
FIG. 2 is a schematic illustration of an equivalent version of the circuit of FIG. 1 without the feedback loop.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention may be a method to improve feedback loops at least with clock gating and to do so, not by looking at the final layout of the circuit, but from its logic level description, for example, from its netlist or its register transfer (RT)-level list. This may both simplify the layout and provide power reduction. In one embodiment, the improvement may involve removing the feedback loop and adding clock-gating. In another embodiment, the improvement may involve just the clock-gating.

In accordance with a preferred embodiment of the present invention, the clock may be gated, and the feedback loop may be removed, for those situations where, irrespective of the values of the inputs, the flip-flop will not change its output Q. These "data-independent" situations may not be all of the situations where output Q does not change; however, they are a significant set of the situations. The present invention may utilize the separation between data independent and data dependent cases to determine if and how the feedback loop may be eliminated.

For instance, for a simple input function, such as (if EN=1 then f(A,B,C) else Q), there are two cases when the output Q will not change value:

1) when EN=0; and
2) when EN=1 and f(A,B,C)=Q.

The first case does not depend on any of the input values A, B or C and thus, is data independent. The second case is data dependent since it depends on the input values A, B or C. Although this example is clearly trivial, the present invention attempts to find similar data independent cases for more complicated circuits or pieces of logic. The data independent case is then utilized to gate the clock of the flip-flop. Although the present specification may discuss circuits with flip-flops, the present invention may also be applicable to circuits with any data latching device, such as a latch.

Figure 3:
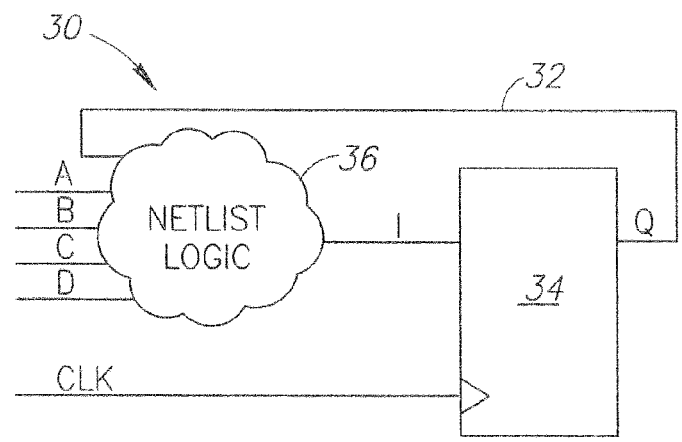
FIG. 3 is a schematic illustration of a complicated circuit with a feedback loop.
Figure 4:
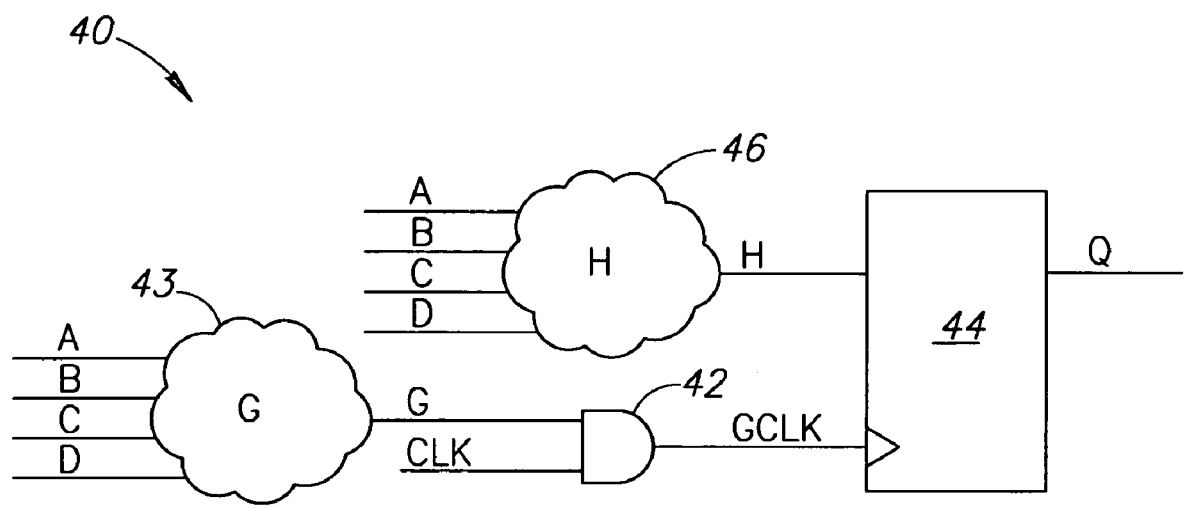
FIG. 4 is a schematic illustration of an equivalent version of the circuit of FIG. 3 without the feedback loop, in accordance with a preferred embodiment of the present invention.

Reference is now made to FIGS. 3 and 4, which generally illustrate the present invention. FIG. 3 shows a circuit 30 which, like that of FIG. 1, has a feedback loop, here labeled 32, from a flip-flop 34. However, in circuit 30, there is some complicated logic, shown as a cloud 36, which defines an input I to flip-flop 34. Logic 36 has five inputs, output Q of flip-flop 34 and four other inputs A, B, C and D. It is assumed that, when logic 36 depends on Q, it depends on it in positive polarity. That is, setting inputs A, B, C, and D to particular values results in f(Q)=Q and, in particular, f(Q)≠¬Q.

The present invention may provide a method to convert circuit 30 to a circuit 40 of FIG. 4, which has a gate 42 providing the gated clock signal, here labeled GCLK, to a flip-flop, here labeled 44. Gate 42 may provide gated clock signal GCLK as a function of clock signal CLK and a function G (shown as a cloud of logic 43). The data input to flip-flop 44 may be a function H, shown as a cloud of logic 46, of inputs A, B, C and D.

It will be appreciated that functions G and H may be (and usually are) different. Moreover, some of the signals shown feeding into logic clouds 43 and 46 may not be used.

Circuit 40 may implement the logic "if G=1 and CLK=1, then H, otherwise Q" while circuit 30 may implement the equivalent logic "if CLK=1, then F(A,B,C . . . Q)". The present invention may separate the function F into the two functions G and H, where G and H together may define the data independent case (i.e. the situation where the input is not a function of Q). Function G is the gating function and function H is the data function.

When is the input I of FIG. 3 not a function of Q? When, after setting the values of inputs A, B, C, and D, the resulting function of Q is 1 or 0, i.e., a constant value, and, in particular, not a function of output Q. Thus, when the input I is defined to be 1 or 0 (and thus, not dependent on Q), gating function G may have a value of 1 to activate flip-flop 44. Data function H should pass those values of original function F that are not dependent on Q. Thus, when original function F is defined to be 0, data function H should generate a 0 and when original function F is defined to be 1, data function H should generate a 1. For all other cases (when F is defined to be Q), data function H may be undefined (i.e. may pass any value).

Figure 5:
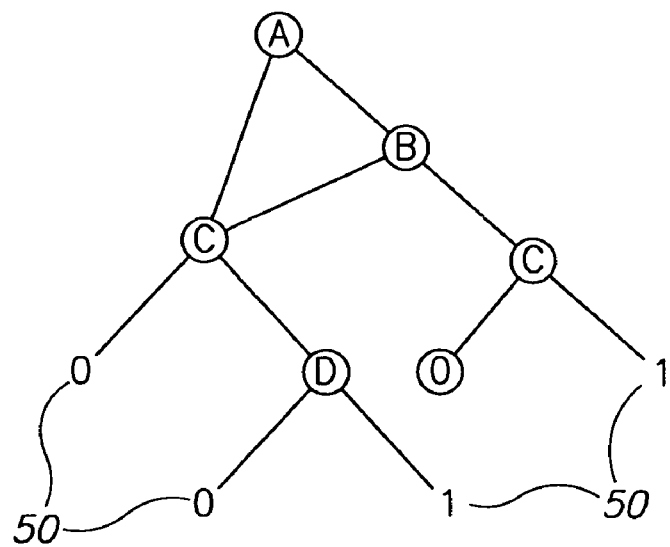
FIG. 5 is a schematic illustration of an exemplary binary decision diagram (BDD) for the expression ((A & B & C)|(C & D))

In accordance with a preferred embodiment of the present invention, gating function G and data function H may be generated using symbolic representations, such as BDDs (binary decision diagrams). Briefly, a BDD is a directed acyclic graph that represents a Boolean expression. FIG. 5, to which reference may be now briefly made, shows an exemplary BDD for the expression ((A & B & C)|(C & D)), where "&" stands for "AND" and "=" stands for "OR". Each circle (or node) indicates a variable (A, B, C, D) and the lines indicate the directions to follow when the variable evaluates FALSE (on the left) or TRUE (on the right). Leaf nodes 50 represent the value of the Boolean expressions.

Many operations may be performed on a BDD. The order of the variables listed may be changed (in FIG. 5, making variable B be last will change the size and shape of the BDD) and Boolean operations may be performed on a BDD.

Figure 6:
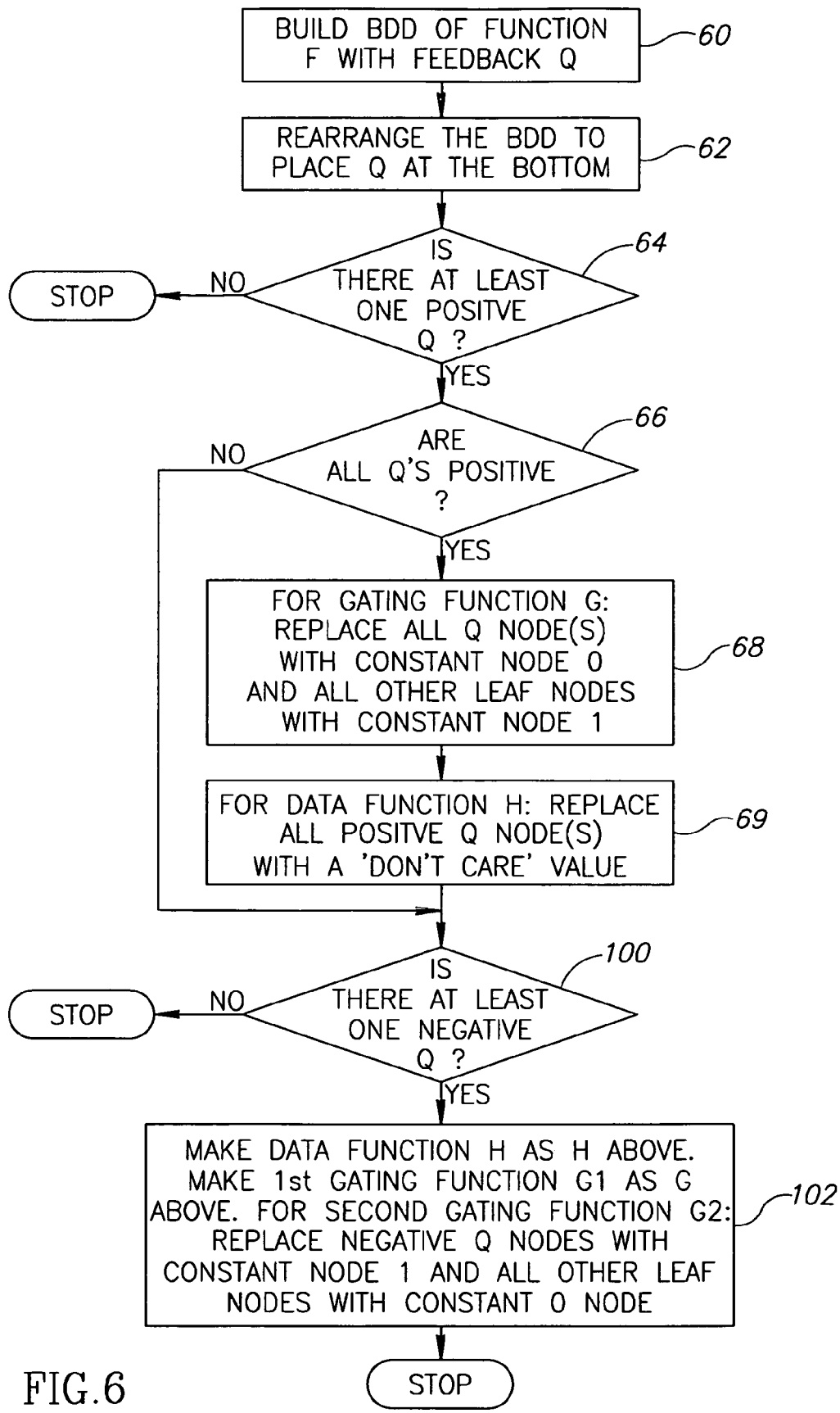
FIG. 6 is a flow chart illustration of a method for determining gating functions and data functions for the circuit of FIG. 4.

BDDs may be utilized in the present invention to determine gating function G and data function H. One such method is described in FIG. 6, to which reference is now made.

In step 60, the BDD of original function F (defining the output of circuit 30) may be generated and, in step 62, it may be rearranged to place output signal Q at the bottom. The status of output signal Q may determine whether or not the feedback loop may be replaced.

Figure 7:
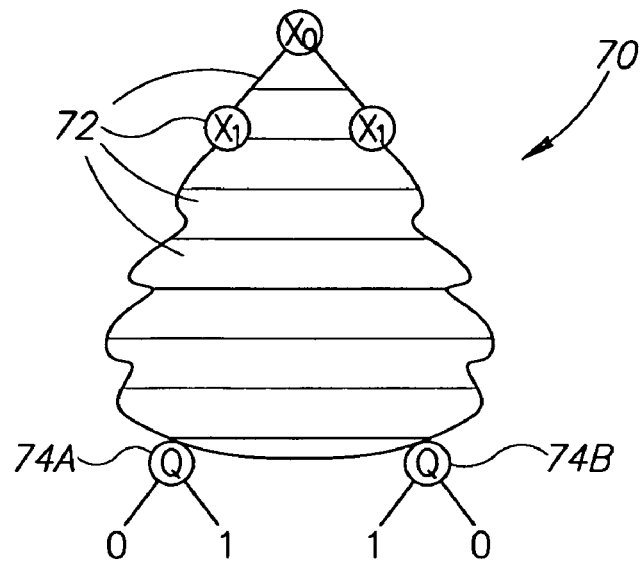
FIG. 7 is a schematic illustration of a generalized BDD.

In step 64, the BDD may be reviewed. FIG. 7, to which reference is now briefly made, shows an exemplary BDD 70. BDD 70 has many levels 72, one for each variable $X_i$. The lowest level is for the variable Q which has two nodes 74A and 74B. Both nodes 74 have leaf nodes that are constant nodes of 1 and 0. However, node 74A has the value 1 on its right-hand side, indicating a positive output when variable Q is evaluated true. Node 74B indicates "negative Q" which provides a zero output when evaluated true.

Returning to FIG. 6, if there is at least one positive Q node 74 in the BDD (as checked in step 64) and if all of the Q nodes 74 are positive (as checked in step 66), then the feedback loop may be removed. If there is at least one positive Q node 74 and also at least one negative Q node (as checked in step 100), then, as discussed in detail hereinbelow with respect to FIGS. 9A, 9B, 10A and 10B, the circuit may be clock-gated but the feedback loop may remain.

For circuits with only positive Q node(s), gating function G may be generated (step 68) by replacing the Q node(s) with the constant node 0 and by replacing all other leaf nodes with the constant node 1. Data function H may be generated (step 69) by replacing the Q node(s) with a "don't care" value.

Figure 8A:
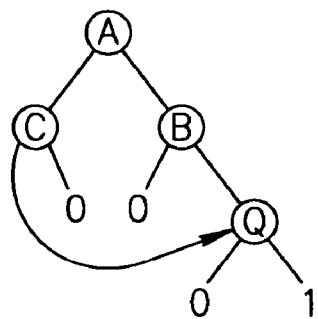
FIG. 8A is a schematic illustration of a simple BDD defining the output of a circuit with a feedback loop.
Figure 8B:
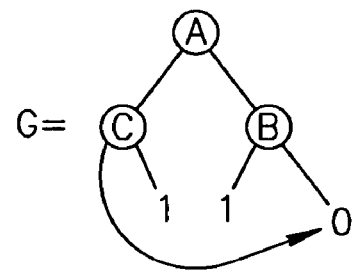
FIGS. 8B and 8C are schematic illustrations of BDDs for gating and data functions, respectively, for the equivalent circuit for the circuit defined by the BDD of FIG. 8A.
Figure 8C:
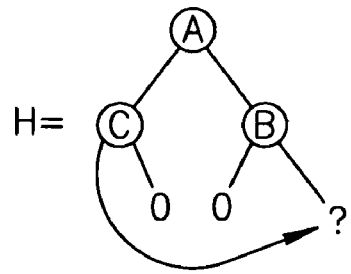

These operations are shown in FIGS. 8A, 8B and 8C, to which reference is now briefly made. FIG. 8A shows an exemplary BDD having a node A branching to nodes B and C. Node B has a left leaf node of 0 and a right node of Q. Q has a right node of 1 and a left node of 0. Node C has a right leaf node of 0 and a left node of Q. FIG. 8B shows the function G. Node Q has been replaced by a leaf node of 0 and the two other leaf nodes are now 1. FIG. 8C shows the function H. Node Q has been replaced by a "don't care" value (shown as a question mark).

Functions G and H may be implemented in hardware to generate circuit 40 (FIG. 4), a clock-gated circuit with no feedback loop.

The method of the present invention may be implemented with other symbolic representations. For instance, at the mathematical level, gating function G may be equivalent to:

$$F_{q=0} = F_{q=1}$$

Data function H may be equivalent to:

(F if G else undefined)

The condition on the BDD may be equivalent to saying that output Q appears in original function F with positive polarity.

For an original function: f( )=(a & b)|(c & d & q), the method of the present invention may produce gating function G as:

$$g(\ )=((a\&b)|!c|!d),$$

and data function H as:

$$h(\ )=(a\ \&\ b).$$

It will be appreciated and obvious to those skilled in the art that the present invention may also be implemented without moving variable Q to the bottom of the BDD. For the latter, a user must perform the equivalent operations on functions G and H that implement the operations described hereinabove and in FIG. 6.

Figure 9A:
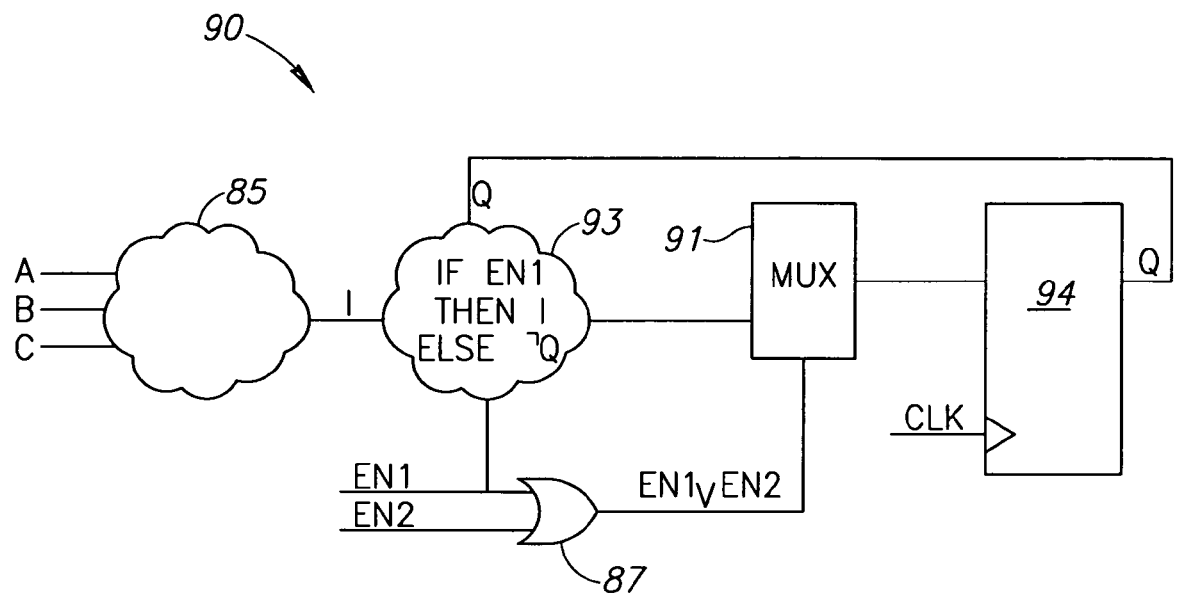
FIG. 9A is a schematic illustration of a complicated circuit with a feedback loop having negative polarity.
Figure 9B:
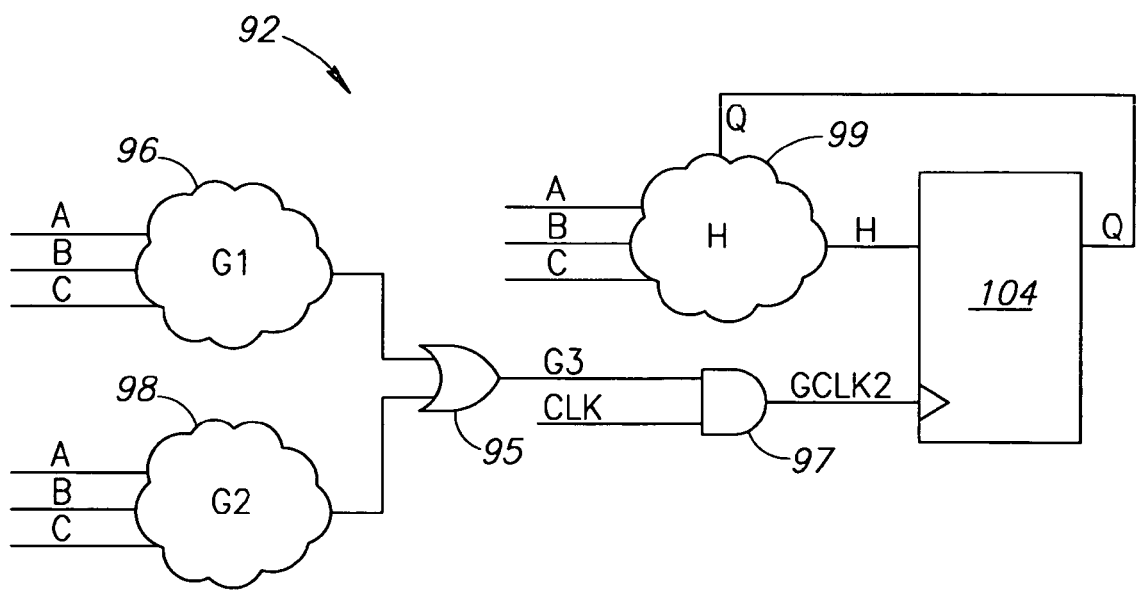
FIG. 9B is a schematic illustration of an equivalent version of the circuit of FIG. 9A with clock gating, in accordance with a second preferred embodiment of the present invention.

Reference is now made to FIGS. 9A and 9B, which illustrate the situation in which a circuit with at least one negative Q input may be clock-gated. FIG. 9A shows an original circuit 90 and FIG. 9B shows an improved circuit 92. It will be obvious to those skilled in the art that a general case, related to FIG. 9A as FIG. 3 is related to FIG. 1, is also solved by the present invention.

Original circuit 90 may comprise a multiplexer 91 and a flip-flop 94 and may be of the type:

of EN1 then I, else if EN2 then NOT Q, else Q

A cloud of logic 85 may generate the signal I and a cloud of logic 93 may receive signal I, output signal Q and an enable signal EN1 and from them, may determine "if EN1 then I else NOT Q". MUX 91 may receive the output of cloud 93, the output Q and the output of an OR gate 87 defined by EN1 OR EN2 and may generate an input signal to flip-flop 94. The other input to flip-flop 94 may be the clock signal CLK.

Improved circuit 92 (FIG. 9B) may separate the data independent signals from the data dependent signals and may implement the equivalent logic "IF (G1=1 or G2=1), then H, otherwise Q".

In accordance with a preferred embodiment of the present invention, the clock signal should be stopped when G1 is 0 and G2 is 0. Thus, circuit 92 may have an OR gate 95 to OR first and second gating functions G1 and G2 (generated by clouds 96 and 98 of logic, respectively). A gate 97 may AND the output of OR gate 95, a signal G3, with clock signal CLK to generate a gated clock signal GCLK2 for a flip-flop 104. Thus, gated clock signal GCLK2 may be active only when gating functions G1 or G2 may be 1.

The data input to flip-flop 104 may be function H, shown as a cloud of logic 99, which may be a function of output Q.

Gating function G1 may be defined similarly to gating function G of the previous embodiment (generated in step 68) and data function H may be defined similarly to data function H of the previous embodiment (generated in step 69). Thus, when the output is defined to be 1 or 0 (and thus, not dependent on Q), gating function G1 may have a value of 1. Data function H should pass those values of original function F that are not dependent on Q. Thus, when original function F is defined to be 0, data function H should generate a 0 and when original function F is defined to be 1, data function H should generate a 1. In addition, when function F is defined to be the negation of Q, data function H should generate the negation of Q. For all other cases, data function H may pass any value. Gating function G2 may be defined to provide 1 when original function F is defined to be NOT Q and 0 otherwise.

Figure 10A:
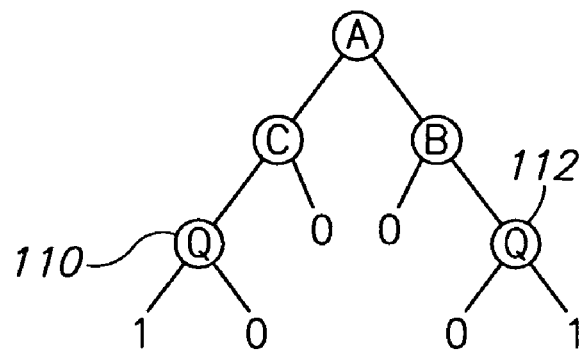
FIG. 10A is a schematic illustration of a simple BDD defining the output of a circuit of the type of FIG. 9A.
Figure 10B:
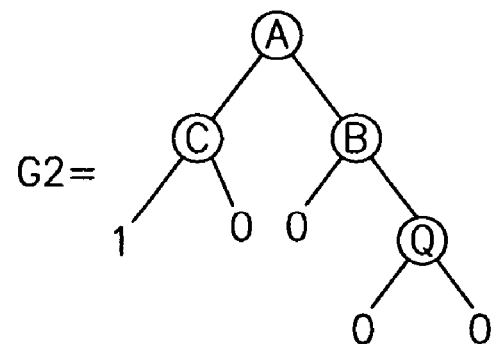
FIG. 10B is a schematic illustration of BDDs for two gating functions for the equivalent circuit for the circuit defined by the BDD of FIG. 10A.
Figure 10B:
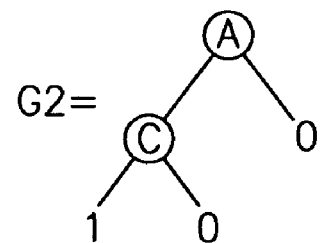

Reference is now made to FIGS. 10A and 10B, which illustrate how to generate gating function G2. FIG. 10A shows an exemplary BDD, similar to that of FIG. 8A, but with one negative Q node 110 (having a right leaf of 0 and a left leaf of 1) and one positive Q node 112. To generate gating function G2, as shown in FIG. 10B, all negative Q nodes, such as negative Q node 110 may be replaced by a constant leaf node with value 1, and the remaining leaf nodes may be replaced with values of 0.

The positive Q node may not be replaced explicitly. However, after the procedure described hereinabove, both of its children are now 0. Thus, according to the reducing rules of BDDs, it may be replaced by a 0. This may result in node B having two identical children, both of which are 0. Thus, by the same reducing rules, it is may be replaced by a 0, resulting in the final BDD shown in FIG. 10B.

Returning to FIG. 6, if, in step 100, there is at least one negative Q node, then the functions G1, G2 and H may be generated (step 102) by making the first gating function as described for gating function G above, by making data function as described for data function H above and by making the second gating function by replacing the negative Q nodes with a constant leaf node of 1 and all the other leaf nodes with constant leaf nodes of 0.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:

given a function F of a circuit having a data latching device and a feedback loop feeding an output Q of said device into logic which feeds said device, extracting at least one data independent case; and clock-gating said device with said at least one data independent case;

also comprising:

eliminating said feedback loop if said function F depends only on Q with a positive polarity;

wherein said eliminating comprises:

generating a gating function G for said device which generates a 1 when the output of function F is defined to have a value of 1 or 0;

ANDing gating function G and a clock signal to generate said clock gating function to said device; and generating a data input function H for said device which passes a 1 when original function F is defined to be a 1, a 0 when original function is defined to be a 0 and any value for all other cases; wherein said first step of generating comprises:

creating a binary decision diagram (BDD) for said circuit with a variable representing said output Q as the last variable in said BDD;

creating a binary decision diagram (BDD) for said gating function G by replacing all Q nodes with a 0 node and by replacing all leaf nodes with a 1 node;

and wherein said second step of generating comprises:

creating a BDD for said data function H by replacing all positive Q nodes with a don't care node.

2. The method according to claim 1 wherein said first step of creating is replaced with generating a BDD where said output Q is not the last variable in said BDD and said second and third steps of creating are the equivalent BDD operations to those of claim 4 but for the case that said output Q is not the last variable in said BDD.

3. The method according to claim 1 and also comprising:

leaving said feedback loop if said function F depends on Q in both positive and negative polarities; wherein said clock-gating comprises:

generating a gating function G3 by ORing two other gating functions G1 and G2 together, where gating function G1 generates a 1 when the output of an original function F defining the output of said device is defined to have a value of 1 or 0 and gating function G2 generates a 1 when original function F is defined to be NOT Q and 0 otherwise;

ANDing gating function G3 and a clock signal to generate said clock gating function to said device; and generating a data input function H for said device which passes a 1 when original function F is defined to be a 1, a 0 when original function is defined to be a 0, a negative Q when original function F is defined to be negative Q and any value for all other cases.

4. The method according to claim 3 and wherein said first step of generating comprises:

creating a binary decision diagram (BDD) for said circuit with a variable representing said output Q as the last variable in said BDD;

creating a BDD for said first gating function G1 by replacing all positive Q nodes with a 0 node and by replacing all leaf nodes with a 1 node;

creating a BDD for said second gating function G2 by replacing all negative Q nodes with said 1 node and all leaf nodes with said 0 node;

and wherein said second step of generating comprises:

creating a BDD for said data function H by replacing all positive Q nodes with a don't care node.

5. The method according to claim 4 wherein said first step of creating is replaced with generating a BDD where said output Q is not the last variable in said BDD and said second and third steps of creating are the equivalent BDD operations to those of claim 4 but for the case that said output Q is not the last variable in said BDD.

* * * * *